(12) United States Patent
Song

(10) Patent No.: US 7,109,825 B2
(45) Date of Patent: Sep. 19, 2006

(54) PASSIVE DEVICES AND MODULES FOR TRANSCEIVER

(75) Inventor: Insang Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 255 days.

(21) Appl. No.: 10/259,427

(22) Filed: Sep. 30, 2002

(65) Prior Publication Data

US 2003/0090882 A1 May 15, 2003

(30) Foreign Application Priority Data

Nov. 15, 2001 (KR) ........................... 2001-71101

(51) Int. Cl.
*H03H 7/01* (2006.01)

(52) U.S. Cl. ...................... 333/184; 333/185; 361/763; 361/782; 361/793

(58) Field of Classification Search ......... 361/760–764, 361/780, 782, 783, 793, 794; 333/174–176, 333/184, 185, 246, 247
See application file for complete search history.

(56) References Cited

U.S. PATENT DOCUMENTS 5,788,854 A * 8/1998 Desaigoudar et al. ......... 216/13
5,915,188 A 6/1999 Ramakrishnan et al.
6,075,713 A * 6/2000 Lee et al. .................... 361/821
6,477,031 B1 * 11/2002 Hayashi .................... 361/306.3
6,590,473 B1 * 7/2003 Seo et al. .................... 333/185
2001/0031690 A1 10/2001 Chikagawa et al.

FOREIGN PATENT DOCUMENTS

EP 0 703 617 A2 3/1996
EP 0 836 229 A2 4/1998

* cited by examiner

*Primary Examiner*—John B. Vigushin
(74) *Attorney, Agent, or Firm*—Buchanan Ingersoll PC

(57) ABSTRACT

A passive device and a module for a transceiver are provided. The passive device for a transceiver includes a semiconductor substrate or a dielectric substrate, at least one capacitor, a dielectric layer, at least one inductor, a via hole, a metal electrode, radio frequency signal lines, and a radio frequency ground. The at least one capacitor is formed on the substrate. The dielectric layer is formed on the capacitor and the substrate. The at least one inductor is formed on the dielectric layer. The via hole penetrates through the dielectric layer. The metal electrode is formed in the via hole and electrically connects the capacitor and the inductor. The radio frequency signal lines are for the inductor and the capacitor. The radio frequency ground is formed on the substrate and isolated from the radio frequency signal lines. A reduction in the area required for mounting passive devices and modules thereof contributes to the downsizing of communication systems. Also, use of the MEMS technique can reduce insertion loss of inductors, which improves the communication quality of communication systems.

22 Claims, 7 Drawing Sheets

PASSIVE DEVICES AND MODULES FOR TRANSCEIVER

This application claims the priority of Korean Patent Application No. 2001-71101, filed Nov. 15, 2001, which is incorporated herein in its entirety by reference.

BACKGROUND OF THE INVENTION

1. Field of the Invention

The present invention relates to passive devices and modules for a transceiver and a method of manufacturing the same, and more particularly, to passive devices and modules for a transceiver in which capacitors, inductors and etc. are formed on and under a dielectric layer using a Micro Electro Mechanical System (MEMS) technique, and connected to each other to form a circuit.

2. Description of the Related Art

As radio communication techniques have been improved, techniques for improving the communication quality of mobile communication systems and downsizing the mobile communication systems have been developed. Also, transmitting and receiving methods for radio communication systems have been developed using separate frequencies in several frequency bands, for example code division multiple access (CDMA) mode using a frequency band of 900 MHz, and personal communication system (PCS) mode using a frequency band of 18 GHz, etc. Therefore, in transceivers that use these multiple bands, the downsizing of the radio communication systems is required.

To downsize personal mobile communication systems, it is most important to reduce the sizes of passive devices, which take up the most space in personal mobile communication systems. Since passive devices used in general mobile communication systems are mostly discrete devices and take up a lot of space on a substrate, they increase the area required for chip mounting and the manufacturing cost. In particular, inductors take up a great deal of space and degrade communication quality.

SUMMARY OF THE INVENTION

To solve the above-described problems, it is a first object of the present invention to provide passive devices for a transceiver which are integrated on and under a dielectric layer using a MEMS technique.

It is a second object of the present invention to provide a module in which a plurality of passive devices for a transceiver are formed on and under a dielectric layer using a MEMS technique, and connected to each other to form a circuit.

Accordingly, to achieve the first object, there is provided a passive device for a transceiver including a semiconductor substrate or a dielectric substrate, at least one capacitor, a dielectric layer, at least one inductor, a via hole, a metal electrode, radio frequency signal lines, and a radio frequency ground. The at least one capacitor is formed on the substrate. The dielectric layer is formed on the capacitor and the substrate. The at least one inductor is formed on the dielectric layer. The via hole penetrates through the dielectric layer. The metal electrode is formed in the via hole and electrically connects the capacitor and the inductor. The radio frequency signal lines are for the inductor and the capacitor. The radio frequency ground is formed on the substrate and isolated from the radio frequency signal lines.

To achieve the second object, there is provided an integrated module for a transceiver including a semiconductor substrate or a dielectric substrate, a plurality of capacitors, a dielectric layer, a plurality of inductors, via holes, a plurality of metal electrodes, radio frequency signal lines, and a plurality of radio frequency grounds. The plurality of capacitors are formed on the substrate. The dielectric layer is formed on the capacitors and the substrate. The plurality of inductors are formed on the dielectric layer. The via holes penetrate through the dielectric layer. The plurality of metal electrodes are formed in the via holes and electrically connect the capacitors and the inductors. The radio frequency signal lines are for the inductors and the capacitors. The plurality of radio frequency grounds are formed on the substrate and isolated from the radio frequency signal lines. Here, a circuit is formed of the capacitors, the inductors, and the radio frequency signal lines. Thee circuit includes a radio frequency selector, duplexers, transmission band-pass filters, and reception band-pass filters. The radio frequency selector is composed of a high-pass filter and a low-pass filter. The duplexers include transmission filters that transmit a signal to the radio frequency selector and are composed of band-pass filters, and reception filters that receive a signal from the radio frequency selector and are composed of band-pass filters. The transmission band-pass filters transmit a signal to the transmission filters via power amplifiers. The reception band-pass filters receive a signal from the reception filters via low noise amplifiers.

At least one radio frequency integrated circuit is further formed to be connected to the capacitors on the substrate.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, embodiments of passive devices and modules for a transceiver of the present invention will now be described in detail with reference to the attached drawings.

Figure 1A:
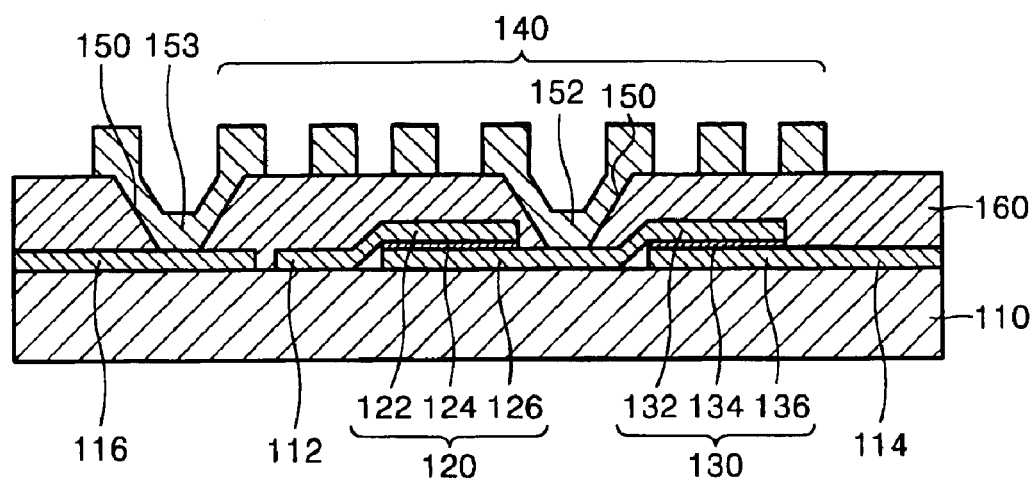
FIGS. 1A and 1B are a schematic cross-sectional view and a partial perspective view of a high-pass filter which is a passive device for a transceiver according to a first embodiment of the present invention.
Figure 1B:
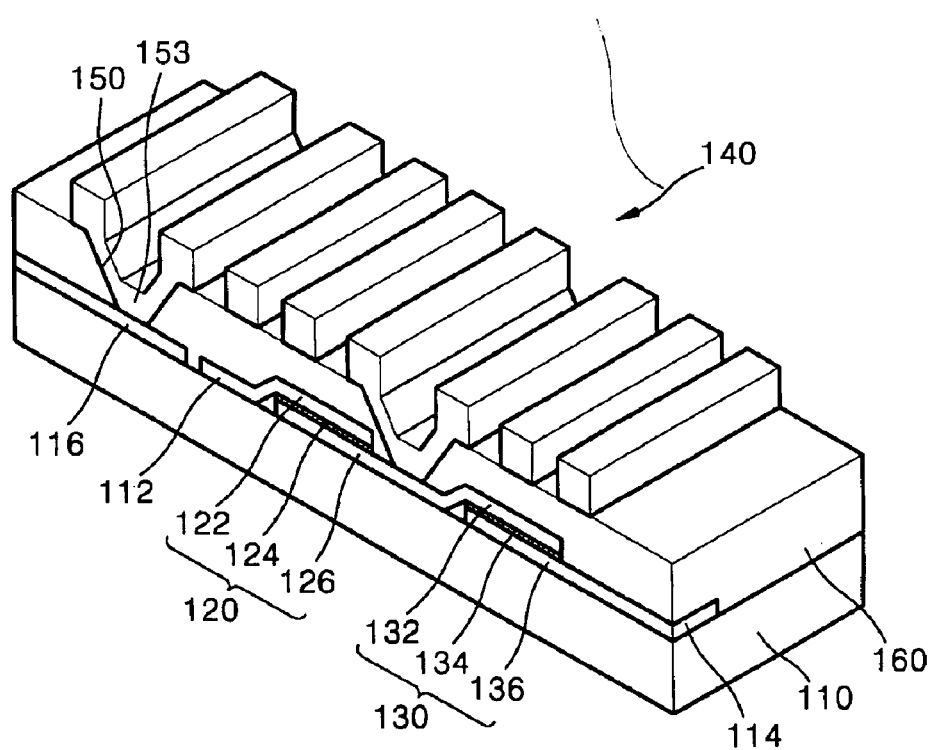
Figure 2:
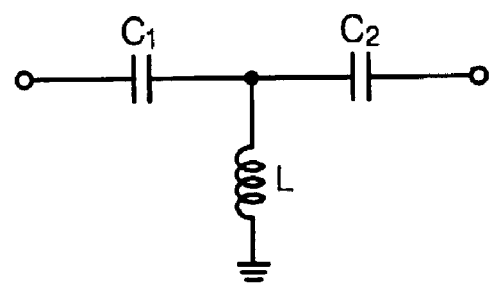
FIG. 2 is an equivalent circuit diagram of the high-pass filter shown in FIGS. 1A and 1B.

FIGS. 1A and 1B are a schematic cross-sectional view and a partial perspective view of a high-pass filter (HPF) which is a passive device for a transceiver according to a first embodiment of the present invention. FIG. 2 is an equivalent circuit diagram of the HPF shown in FIGS. 1A and 1B. As shown in FIG. 2, the HPF has a basic circuit configuration in which one inductor L is connected in parallel between two capacitors C1 and C2 that are connected in series to each other. FIGS. 1A and 1B show that the HPF having this equivalent circuit configuration is stacked on a substrate 110. A first capacitor 120 and a second capacitor 130 are connected in series to each other on the substrate 110. A dielectric layer 160 is formed to cover the substrate 110 and the first and second capacitors 120 and 130, and an inductor 140 is formed on the dielectric layer 160. The inductor 140 is connected to a connection between the first and second capacitors 120 and 130 underneath the dielectric layer 160 via an electrode 152 that is formed in a via hole 150. The substrate 110 is formed of a semiconductor or a dielectric.

The first and second capacitors 120 and 130 are manufactured by a MEMS technique. The first capacitor 120 is composed of a second electrode 126 that is a lower electrode formed on the substrate 110, a first electrode 122 that is an upper electrode opposite to the second electrode 126, and a first dielectric 124 that is interposed between the first and second electrodes 122 and 126. The second capacitor 130 is composed of an upper electrode 132 that is formed by extending the second electrode 126, a third electrode 136 that is a lower electrode, and a second dielectric 134 that is interposed between the upper electrode 132 and the third electrode 136. An end of the first electrode 122 is connected to an input signal line 112, an end of the third electrode 136 is connected to an output signal line 114, and a ground 116 is formed beside the input and output signal lines 112 and 114 to transmit radio frequency (RF) signals of the input and output signal lines 112 and 114. This ground 116 is connected to an end of the inductor 140 via an electrode 153 that is formed in a via hole 150.

In the HPF having the above-described structure, if a signal having a predetermined frequency is input from the input signal line 112, the signal having a predetermined frequency is transmitted through the first and second capacitors 120 and 130 to the output signal line 114. A signal below a predetermined frequency is output through the inductor 140 to the ground 116.

Figure 3:
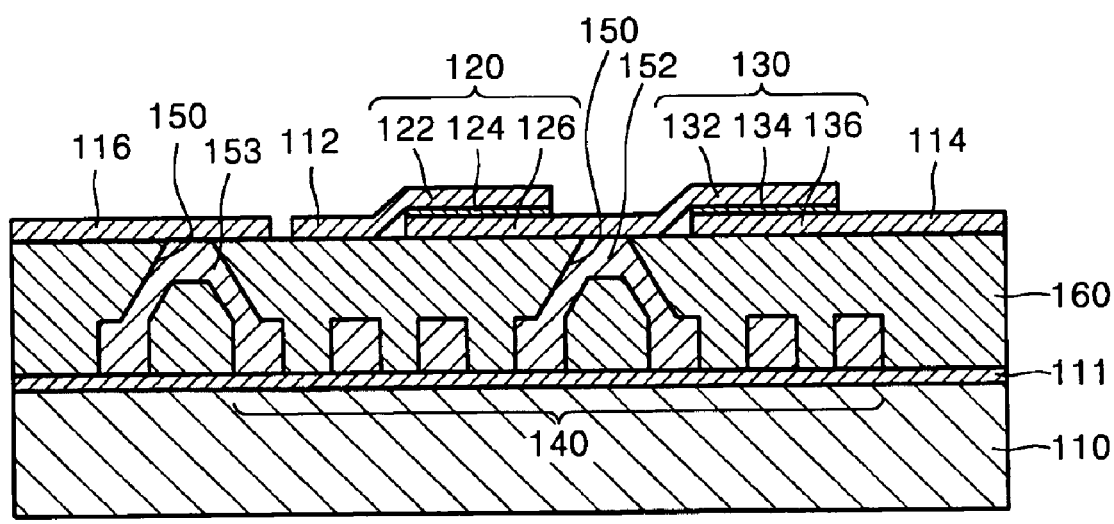
FIG. 3 is a cross-sectional view of a modified example of the first embodiment of the present invention.

FIG. 3 is a cross-sectional view of a modified example of the first embodiment. Elements which are the same as those of the first embodiment are denoted with the same reference numerals. Thus detailed descriptions thereof will be omitted.

A dielectric film 111 is formed on a substrate 110, and an inductor 140 is formed on the dielectric film 111. A dielectric layer 160 is formed on the dielectric film 111 to cover the inductor 140. The inductor 140 is connected to a connection between the first and second capacitors 120 and 130 on the dielectric layer 160 via an electrode 152 that is formed in a via hole 150.

The dielectric film 111 is formed of polyimide or benzylchlobutene (BCB) polymer to prevent RF signal loss if the substrate 110 is a semiconductor.

The operation of the HPF having the above-described structure is similar to the structure of the HPF of the first embodiment, and thus its detailed descriptions will be omitted.

Figure 4:
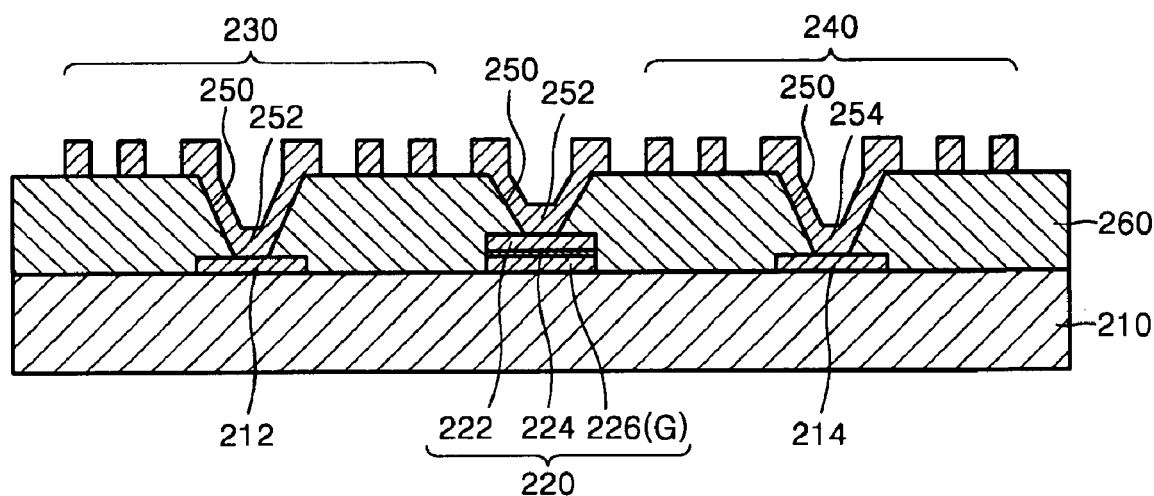
FIG. 4 is a schematic cross-sectional view of a low-pass filter which is a passive device for a transceiver according to a second embodiment of the present invention.
Figure 5:
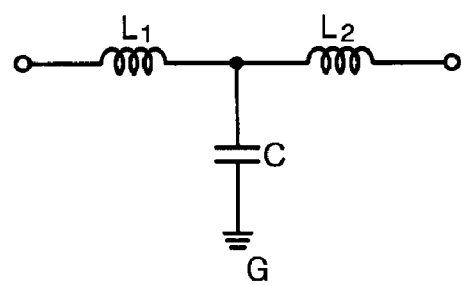
FIG. 5 is an equivalent circuit diagram of the low-pass filter shown in FIG. 4.

FIG. 4 is a schematic cross-sectional view of a low-pass filter (LPF) that is a passive device for a transceiver according to a second embodiment of the present invention. FIG. 5 is an equivalent circuit diagram of the LPF shown in FIG. 4. As shown in FIG. 5, the LPF has a basic circuit configuration in which one capacitor C is connected in parallel between two inductors L1 and L2 FIG. 4 shows that the LPF having this equivalent circuit configuration is stacked on a substrate 210. A capacitor 220 is formed on the substrate 210, and a dielectric layer 260 is formed on the substrate 210 to cover the capacitor 220. First and second inductors 230 and 240 are connected in series to each other on the dielectric layer 260. The capacitor 220 is connected to a connection between the first and second inductors 230 and 240 on the substrate 210 via an electrode 252 that is formed in a via hole 250. The substrate 210 is formed of a semiconductor or a dielectric. An end of the first inductor 230 is connected to an input signal line 212 on the substrate 210 via an electrode 252, an end of the second inductor 240 is connected to an output signal line 214 on the substrate 210 via the electrode 254, and a lower electrode 226 of the capacitor 220 is connected to a ground G.

The capacitor 220 is manufactured by the MEMS technique. The capacitor 220 is composed of a lower electrode 226 that is formed on the substrate 210, an upper electrode 222 that is opposite to the lower electrode 226, and a dielectric 224 that is interposed between the lower and upper electrodes 226 and 222.

The first and second inductors 230 and 240 are manufactured by the MEMS technique and connected to the capacitor 220 via the via hole 250.

In the LPF having the above-described structure, if a signal having a predetermined frequency is input from the input signal line 212 that is connected to an end of the first inductor 230, the signal is transmitted through the first and second inductors 230 and 240 to the output signal line 214 that is connected to the other end of the second inductor 240. A signal above a predetermined frequency is output to the ground G through the capacitor 220.

Figure 6:
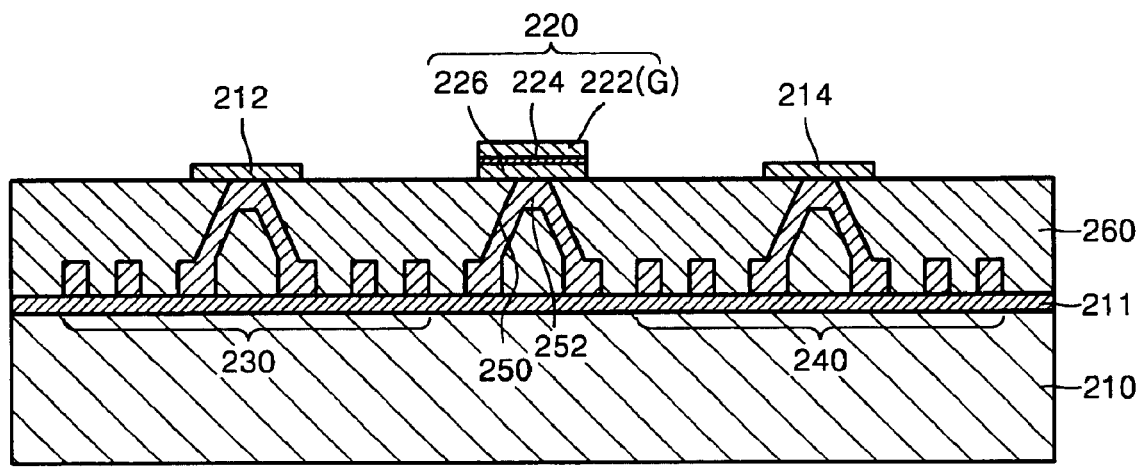
FIG. 6 is a cross-sectional view of a modified example of the second embodiment of the present invention.

FIG. 6 is a cross-sectional view of a modified example of the second embodiment. The same reference numerals as those of the first embodiment denote the same elements and their detailed descriptions will be omitted.

Referring to FIG. 6, a dielectric film 211 is formed on a substrate 210. Two inductors 230 and 240 are formed on the dielectric film 211. A dielectric layer 260 is formed on the inductors 230 and 240 to cover the dielectric film 211. A connection between the inductors 230 and 240 is connected to a lower electrode 226 of a capacitor 220 on the dielectric layer 260 via an electrode 252 formed in a via hole 250.

The dielectric film 211 is formed of polyimide or benzylchlobutene (BCB) polymer to prevent RF signal loss if the substrate 210 is a semiconductor.

The operation of the LPF having the above-described structure is similar to the structure of the LPF of the second embodiment, and thus its detailed descriptions will be omitted.

Figure 7:
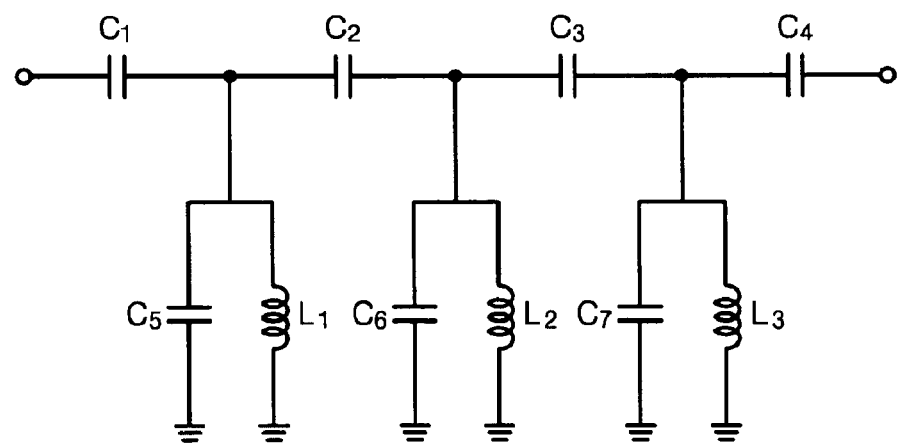
FIG. 7 is an equivalent circuit diagram of a band-pass filter which is a passive device for a transceiver according to a third embodiment of the present invention.

FIG. 7 is an equivalent circuit diagram of a band-bass filter (BPF) that is a passive device for a transceiver according to a third embodiment of the present invention. Referring to FIG. 7, a plurality of capacitors C1, C2, C3 and C4 are connected in series to each other. Other capacitors C5, C6, and C7 and inductors L1, L2, and L3 are connected in parallel to each other between the capacitors C1, C2, C3, and C4 To stack this equivalent circuit on one substrate, the capacitors C1, C2, C3, C4, C5, C6, and C7 are formed on a substrate and a dielectric layer is formed to cover the capacitors C1, C2, C3, C4, C5, C6, and C7. The inductors L1, L2, and L3 are formed on the dielectric layer to be connected to the capacitors C1, C2, C3, C4, C5, C6, and C7 via an electrode (Refer to 152 of FIGS. 1A and 1B and 252 of FIG. 5) formed in a via hole that penetrates through the dielectric layer.

As an modified example of the above-described structure, to stack the circuit on one substrate, after a thin dielectric film is formed on the substrate, inductors L1, L2, and L3 are formed on the dielectric film and a dielectric layer is formed to cover the inductors L1, L2, and L3 and the dielectric film. Capacitors C1, C2, C3, C4, C5, C6, and C7 are formed on the dielectric layer to be connected to the inductors L1, L2, and L3 via a via hole electrode that penetrates through the dielectric layer.

The inductors L1, L2, and L3 and the capacitors C1, C2, C3, C4, C5, C6, and C7 are manufactured by the MEMS technique.

In the BPF having the above-described structure, a signal having a predetermined frequency is input to an end of the first capacitor C1, and the signal is filtered through circuits of the capacitors C1, C2, C3, C4, C5, C6, and C7 and the inductors L1, L2, and L3 and transmitted to an output signal line at an end of the capacitor C4.

Figure 8:
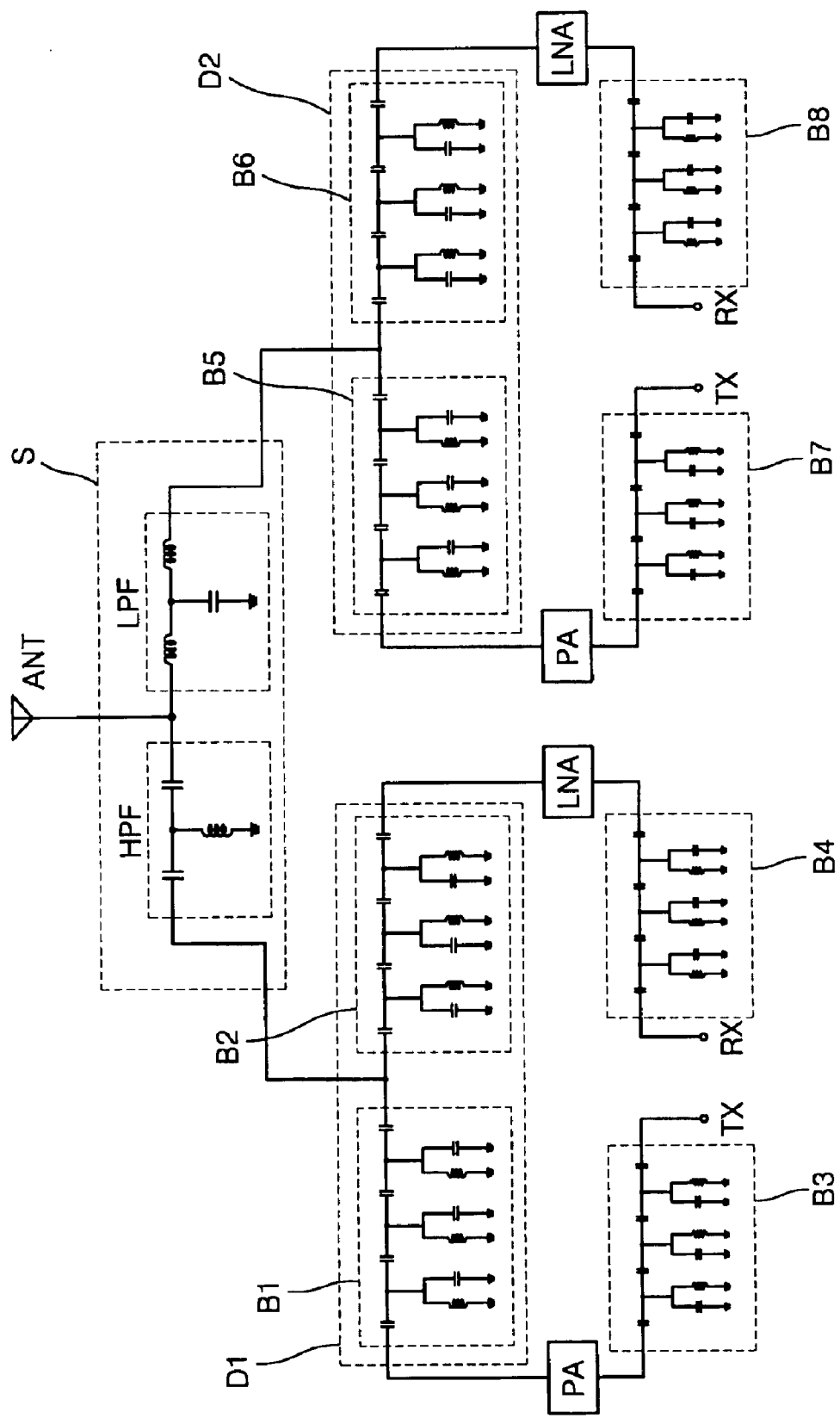
FIG. 8 is an equivalent circuit diagram of an integrated module which is a passive device for a transceiver according to a fourth embodiment of the present invention.

FIG. 8 is an equivalent circuit diagram of an integrated module that is a passive device for a transceiver according to a fourth embodiment of the present invention. This integrated module can be used for two frequency bands: a PCS mode using a transmission and reception frequency in a frequency band of 1.8 GHz and a CDMA mode using a transmission and reception frequency in a frequency band of 0.9 GHz.

Referring to FIG. 8, the integrated module that is a passive device for a transceiver is composed of a radio frequency (RF) selector S, duplexers D1 and D2, transmission band-pass filters B3 and B7, and reception band-pass filters B4 and B8. The RF selector S identifies a frequency signal from a transmission and reception antenna ANT. Duplexers D1 and D2 receive and switch a signal received from the transmission and reception antenna ANT and a signal that will be transmitted to the transmission and reception antenna ANT. Transmission band-pass filters B3 and B7 filter a signal that will be transmitted to the duplexers D1 and D2. Reception band-pass filters B4 and B8 filter a signal received from the duplexers D1 and D3.

The RF selector S includes a HPF and a LPF which are the same as those described in the first and second embodiments, respectively. The duplexers D1 and D2 include transmission filters B1 and B5, respectively, and reception filters B2 and B6, respectively, which are composed of band-pass filters described in the third embodiment.

To stack the equivalent circuit shown in FIG. 8 on a substrate, a plurality of capacitors are connectedly formed on the substrate as previously described and a dielectric layer is formed on the substrate to cover the capacitors. Inductors are formed on the dielectric layer to be connected to the capacitors via an electrode (Refer to 152 of FIGS. 1A and 1B and 252 of FIG. 5) formed in a via hole that penetrates through the dielectric layer.

As a modified example of the above-described structure, to stack the circuit on a substrate, a thin dielectric film is formed on the substrate. Next, inductors are formed on the thin dielectric film, and then a dielectric layer is formed to cover the inductors and the substrate. Capacitors are formed on the dielectric layer to be connected to the inductors via a via hole electrode that penetrates through the dielectric layer.

Thus, the connection between the passive devices is realized by the MEMS technique through a substrate. The integrated module having the above-described structure serves as a radio transceiver connected to an external integrated circuit (IC) including a converter between an audio signal and an electric circuit, a modulator for modulating a low frequency signal into a high frequency signal, an amplifier, etc.

The operation of the integrated module for a transceiver having the above-described structure will be described in detail with reference to FIG. 8. First, a process of transmitting a signal will be described. Transmission nodes Tx transmit a signal, the transmission band-pass filters B3 and B7 filter the signal, power amplifiers (PAs) amplify the signal, the transmission filters B1 and B5 of the duplexers D1 and D2 filter the signal, the HPF or LPF transmits the signal to the transmission and reception antenna ANT and then to the outside.

Next, a process of receiving a signal will be described. A signal received from the transmission and reception antenna ANT selects its reception path in the RF selector S based on the frequency of the signal. The reception filters B2 and B6 of the duplexers D1 and D2 filter the signal and low noise amplifiers (LNAs) amplify the signal. The transmission band-pass filters B4 and B8 filter the signal and output the signal to reception nodes Rx.

Figure 9:
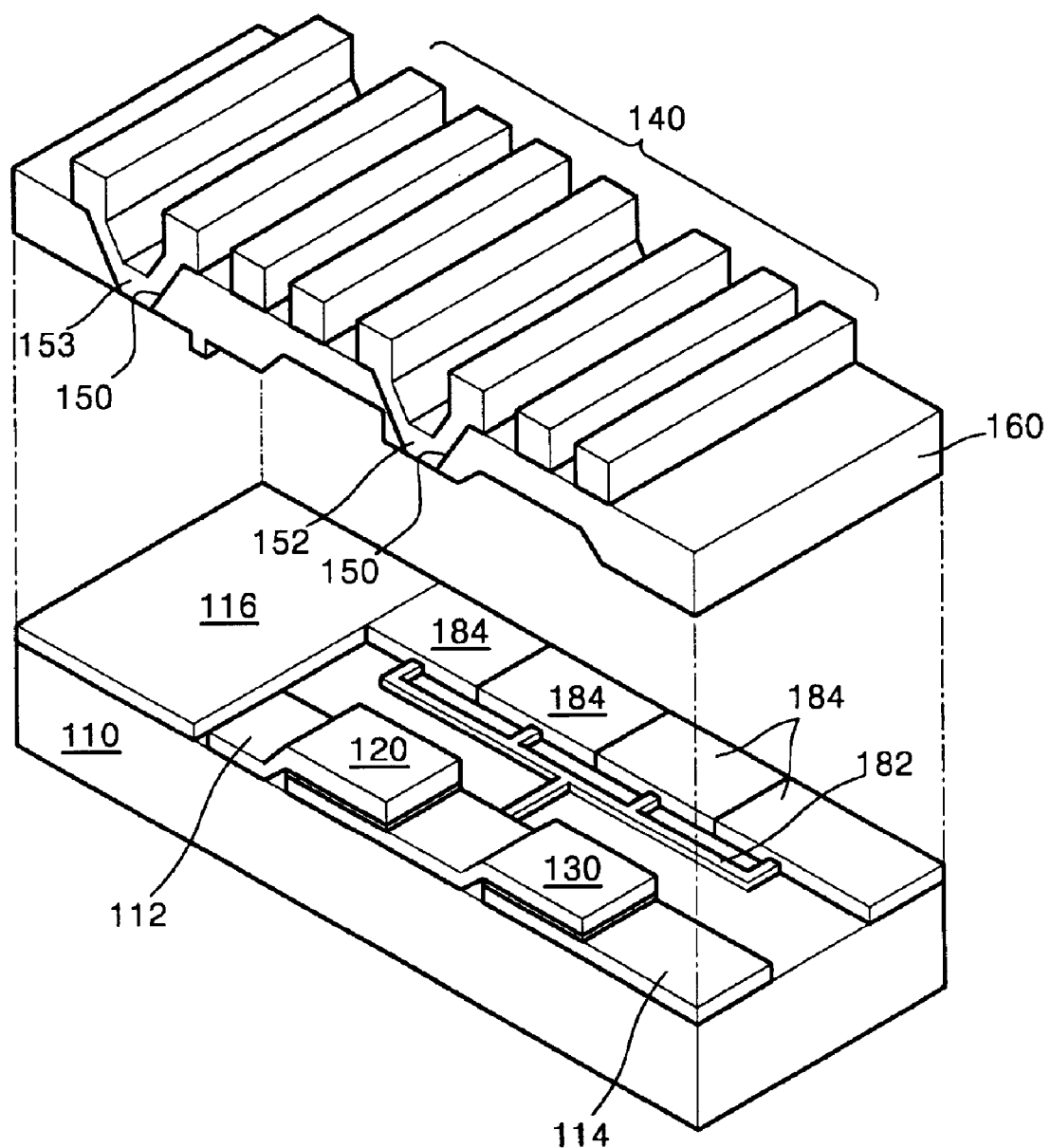
FIG. 9 is an exploded perspective view for explaining the integrated module according to the fourth embodiment of the present invention.

FIG. 9 is an exploded perspective view showing a RF IC prepared on a substrate of the HPF of FIG. 1B, which is used to describe the fourth embodiment of the present invention in detail. Like reference numerals in the fourth embodiment denote the same members in the first embodiment and their detailed description will be omitted. Referring to FIG. 9, capacitors 120 and 130 are connected in series to each other on a substrate 110. A dielectric layer 160 is formed on the substrate 110 and the capacitors 122 and 132 to cover the substrate 110 and the capacitors 120 and 130. An inductor 140 is formed on the dielectric layer 160. The inductor 140 is connected to a connection between the capacitors 120 and 130 underneath the dielectric layer 160 via an electrode 152 formed in a via hole 150. The substrate 110 is formed of a semiconductor or a dielectric.

A plurality of RF integrated circuits (ICs) 184 are connected to a signal line 182 that is connected to the connection between the capacitors 120 and 130.

Figure 10:
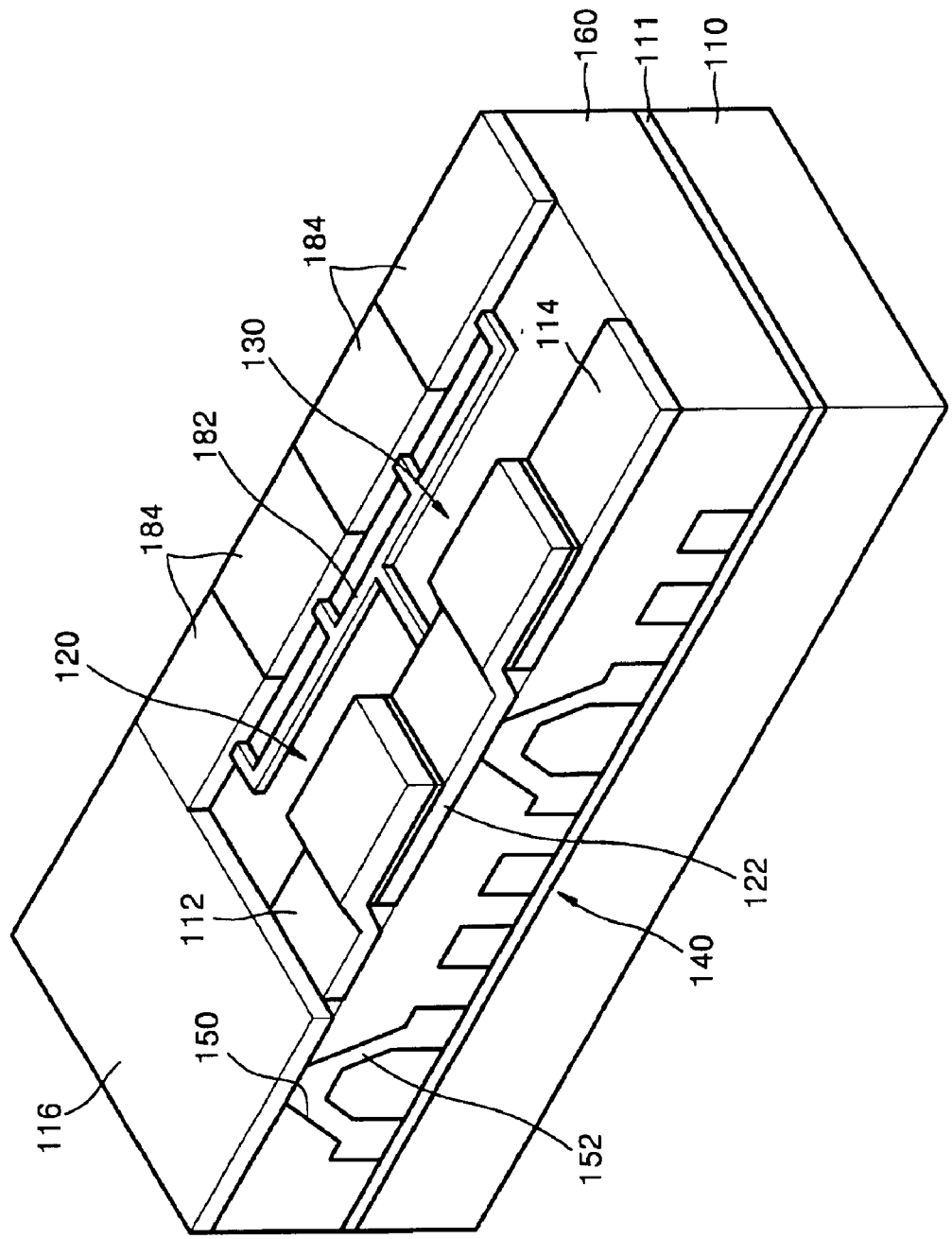
FIG. 10 is a perspective view of a modified example of the fourth embodiment of the present invention.

FIG. 10 shows a plurality of RF ICs prepared on a substrate of the HPF of FIG. 3, which is used to describe the fourth embodiment of the present invention in detail. Like reference numerals in the fourth embodiment denote the same members in the first embodiment and their detailed description will be omitted.

Referring to FIG. 10, a dielectric film 111 is formed on a substrate 110, and an inductor 140 is formed on the dielectric film 111. And, a dielectric layer 160 is formed over the dielectric film 111 to cover the inductor 140. Two capacitors 120 and 130 are formed on the dielectric layer 160 and a plurality of RF ICs 184 are connected to a signal line 182 that is connected to a connection between the capacitors 120 and 130.

The RF IC 184 may be an oscillator, a mixer, a LNA or a driver amplifier, and is composed of resistor(s), capacitor(s), and inductor(s). The RF IC 184 may be a general discrete device or may be a circuit in which at least one capacitor (not shown) is formed on a first surface of the dielectric layer 160, at least one inductor (not shown) is formed on a second surface of the dielectric layer 160, and an electrode formed on a via hole connects the capacitor to the inductor by the method of the previous embodiments.

As described above, a reduction in the area required for mounting passive devices and modules thereof according to the present invention contributes to the downsizing of communication systems also, use of the MEMS technique can reduce insertion loss of inductors, which improves the communication quality of communication systems.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A passive device for a transceiver comprising:
   one of a semiconductor substrate and a dielectric substrate;
   at least one capacitor which is formed on the substrate;
   a dielectric layer which is formed on the capacitor and the substrate;
   at least one inductor which is formed on the dielectric layer;
   a via hole which penetrates through the dielectric layer;
   a metal electrode which is formed in the via hole and electrically connects the capacitor and the inductor;
   radio frequency signal lines for the inductor and the capacitor; and
   a radio frequency ground which is formed on the substrate and isolated from the radio frequency signal lines.

2. The passive device for a transceiver of claim 1, wherein a high-pass filter is formed of two capacitors and one inductor and the inductor is connected in parallel to the capacitors via the via hole.

3. The passive device for a transceiver of claim 1, wherein a low-pass filter is formed of one capacitor and two inductors and the capacitor is connected in parallel to the inductors via the via hole.

4. The passive device for a transceiver of claim 1, wherein a band-pass filter is formed of a plurality of capacitors that are connected to each other in series, capacitors that are connected in parallel between the capacitors connected in series, and inductors that are connected in parallel between the capacitors that are connected in series via the via hole.

5. An integrated module for a transceiver comprising:
   one of a semiconductor substrate and a dielectric substrate;
   a plurality of capacitors which are formed on the substrate;
   a dielectric layer which is formed on the capacitors and the substrate;
   a plurality of inductors which are formed on the dielectric layer;
   via holes which penetrate through the dielectric layer;
   a plurality of metal electrodes which are formed in the via holes and electrically connect the capacitors and the inductors;
   radio frequency signal lines for the inductors and the capacitors; and
   a plurality of radio frequency grounds which are formed on the substrate and isolated from the radio frequency signal lines,
   wherein a circuit is formed of the capacitors, the inductors, and the radio frequency signal lines, the circuit comprising:
   a radio frequency selector which is composed of a high-pass filter and a low-pass filter;
   duplexers which include transmission filters that transmit a signal to the radio frequency selector and are composed of band-pass filters, and reception filters that receive a signal from the radio frequency selector and are composed of band-pass filters;
   transmission band-pass filters which transmit a signal to the transmission filters via power amplifiersp; and
   reception band-pass filters which receive a signal from the reception filters via low noise amplifiers.

6. The integrated module for a transceiver of claim 5, further comprising at least one radio frequency integrated circuit which is connected to the capacitors on the substrate.

7. The integrated module for a transceiver of claim 6, wherein the radio frequency integrated circuit is one of a discrete device and a circuit which includes at least one capacitor that is formed on the substrate, at least one inductor that is formed on the dielectric layer, and an electrode that is formed on a via hole and electrically connects the capacitor and the inductor.

8. The integrated module for a transceiver of claim 5, wherein the high-pass filter comprises two capacitors and one inductor and the inductor is connected in parallel to the capacitors via the via hole.

9. The integrated module for a transceiver of claim 5, wherein the low-pass filter comprises one capacitor and two inductors and the capacitor is connected in parallel to the inductors via the via hole.

10. The integrated module for a transceiver of claim 5, wherein the band-pass filter comprises a plurality of capacitors that are connected in series to each other, capacitors that are connected in parallel between the capacitors connected in series, and inductors that are connected in parallel between the capacitors that are connected in series via the via hole.

11. A passive device for a transceiver comprising:
    one of a semiconductor substrate and a dielectric substrate;
    at least one inductor which is formed on the substrate;
    a dielectric layer which is formed to cover the substrate and the inductor;
    at least one capacitor which is formed on the dielectric layer;
    a via hole which penetrates through the dielectric layer;
    a metal electrode which is formed on the via hole and electrically connects the capacitor and the inductor;
    radio frequency signal lines for the inductor and the capacitor; and
    a radio frequency ground which is formed on the dielectric layer and isolated from the radio frequency signal lines.

12. The passive device for a transceiver of claim 11, further comprising a dielectric film that is formed between the substrate and the inductor.

13. The passive device for a transceiver of claim 11, wherein a high-pass filter is formed of two capacitors and one inductor and the inductor is connected in parallel to the capacitors via the via hole.

14. The passive device for a transceiver of claim 11, wherein a low-pass filter is formed of one capacitor and two inductors and the capacitor is connected in parallel to the inductors via the via hole.

15. The passive device for a transceiver of claim 11, wherein a band-pass filter is formed of a plurality of capacitors that are connected in series to each other, capacitors that are connected in parallel between the capacitors connected in series, and inductors that are connected in parallel between the capacitors that are connected in series via the via hole.

16. An integrated module for a transceiver comprising:
one of a semiconductor substrate and a dielectric substrate;
a plurality inductors which are formed on the substrate;
a dielectric layer which is formed to cover the substrate and the inductors;
a plurality of capacitors which are formed on the dielectric layer;
a plurality via holes which penetrate through the dielectric layer;
a plurality of metal electrodes which are formed on the via holes and electrically connect the capacitors and the inductors;
radio frequency signal lines for the inductor and the capacitor; and
a plurality of radio frequency grounds which are formed on the dielectric layer and isolated from the radio frequency signal lines,
wherein a circuit is formed of the capacitors, the inductors, and the radio frequency signal lines, the circuit comprising:
a radio frequency selector which is composed of a high-pass filter and a low-pass filter;
duplexers which include transmission filters that transmit a signal to the radio frequency selector and are composed of band-pass filters, and reception filters that receive a signal from the radio frequency selector and are composed of band-pass filters;
transmission band-pass filters which transmit a signal to the transmission filters via power amplifiers; and
reception band-pass filters which receive a signal from the reception filters via low noise amplifiers.

17. The integrated module for a transceiver of claim 16, further comprising a dielectric film that is formed between the substrate and the inductor.

18. The integrated module for a transceiver of claim 16, further comprising at least one radio frequency integrated circuit which is connected to the capacitors on the substrate.

19. The integrated module for a transceiver of claim 16, wherein the radio frequency integrated circuit is one of a discrete device and a circuit which includes at least one capacitor that is formed on the substrate, at least one inductor that is formed on the dielectric layer, and an electrode that is formed on a via hole and electrically connects the capacitor and the inductor.

20. The integrated module for a transceiver of claim 16, wherein the high-pass filter comprises two capacitors and one inductor and the inductor is connected in parallel to the capacitors via the via hole.

21. The integrated module for a transceiver of claim 16, wherein the low-pass filter comprises one capacitor and two inductors and the capacitor is connected in parallel to the inductors via the via hole.

22. The integrated module for a transceiver of claim 16, wherein the band-pass filter comprises a plurality of capacitors that are connected in series to each other, capacitors that are connected in parallel between the capacitors connected in series, and inductors that are connected in parallel between the capacitors that are connected in series via the via hole.

* * * * *